(12) United States Patent
Liu et al.

(10) Patent No.: US 9,576,788 B2
(45) Date of Patent: Feb. 21, 2017

(54) CLEANING HIGH ASPECT RATIO VIAS

(71) Applicant: Applied Materials, Inc., Santa Clara, CA (US)

(72) Inventors: Jie Liu, Sunnyvale, CA (US); Seung Park, San Jose, CA (US); Anchuan Wang, San Jose, CA (US); Zhenjiang Cui, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 6 days.

(21) Appl. No.: 14/695,392

(22) Filed: Apr. 24, 2015

(65) Prior Publication Data

US 2016/0314961 A1    Oct. 27, 2016

(51) Int. Cl.
*H01L 21/02*      (2006.01)
*H01L 21/311*     (2006.01)
*H01L 27/115*     (2006.01)
*H01L 21/027*     (2006.01)
(Continued)

(52) U.S. Cl.
CPC ... *H01L 21/02057* (2013.01); *H01L 21/02063* (2013.01); *H01L 21/0273* (2013.01); *H01L 21/02381* (2013.01); *H01L 21/02532* (2013.01); *H01L 21/02598* (2013.01); *H01L 21/3065* (2013.01); *H01L 21/3081* (2013.01);
(Continued)

(58) Field of Classification Search
CPC ............. H01L 21/02057; H01L 21/02063; H01L 21/31111; H01L 27/11556; H01L 21/02532; H01L 21/02381; H01L 21/02598; H01L 21/0273; H01L 21/3065; H01L 21/3081; H01L 27/11582
See application file for complete search history.

(56) References Cited

U.S. PATENT DOCUMENTS 6,638,855 B1 * 10/2003 Chang ............... H01L 21/02063
                                                   257/E21.226
6,673,721 B1 *  1/2004 Kim ................... H01L 21/02063
                                                   257/E21.252
(Continued)

FOREIGN PATENT DOCUMENTS

JP    2001-015712 A    1/2001
JP    2013-197417 A    9/2013

*Primary Examiner* — Anita Alanko
(74) *Attorney, Agent, or Firm* — Kilpatrick Townsend & Stockton LLP

(57) ABSTRACT

A method of removing an amorphous silicon/silicon oxide film stack from vias is described. The method may involve a remote plasma comprising fluorine and a local plasma comprising fluorine and a nitrogen-and-hydrogen-containing precursor unexcited in the remote plasma to remove the silicon oxide. The method may then involve a local plasma of inert species to potentially remove any thin carbon layer (leftover from the photoresist) and to treat the amorphous silicon layer in preparation for removal. The method may then involve removal of the treated amorphous silicon layer with several options possibly within the same substrate processing region. The bottom of the vias may then possess exposed single crystal silicon which is conducive to epitaxial single crystal silicon film growth. The methods presented herein may be particularly well suited for 3d NAND (e.g. VNAND) device formation.

12 Claims, 7 Drawing Sheets

(51) Int. Cl.
    *H01L 21/3065*    (2006.01)
    *H01L 21/308*    (2006.01)
(52) U.S. Cl.
    CPC ... *H01L 21/31111* (2013.01); *H01L 27/11556* (2013.01); *H01L 27/11582* (2013.01)

(56) References Cited

U.S. PATENT DOCUMENTS

| | | | |
|---|---|---|---|
| 6,756,315 B1* | 6/2004 | Bamnolker | H01L 21/02063 257/E21.577 |
| 8,399,360 B1* | 3/2013 | Miller | H01L 21/02063 438/622 |
| 9,343,358 B1* | 5/2016 | Xu | H01L 21/76877 |
| 2007/0087949 A1 | 4/2007 | Wu et al. | |
| 2008/0057702 A1* | 3/2008 | Fukumizu | H01L 21/02063 438/624 |
| 2010/0055897 A1 | 3/2010 | Chou et al. | |
| 2010/0105212 A1 | 4/2010 | Jung | |
| 2011/0139750 A1 | 6/2011 | Lee et al. | |
| 2012/0196446 A1 | 8/2012 | Graff | |
| 2013/0171822 A1 | 7/2013 | Chandrashekar et al. | |
| 2013/0196500 A1 | 8/2013 | Batude et al. | |
| 2013/0260533 A1 | 10/2013 | Sapre et al. | |
| 2013/0302980 A1 | 11/2013 | Chandrashekar et al. | |
| 2014/0097541 A1 | 4/2014 | Lin | |
| 2014/0299973 A1 | 10/2014 | Lin | |
| 2014/0349477 A1 | 11/2014 | Chandrashekar et al. | |
| 2014/0353805 A1 | 12/2014 | Ryan et al. | |
| 2016/0064212 A1* | 3/2016 | Thedjoisworo | H01L 21/02063 438/710 |

\* cited by examiner

CLEANING HIGH ASPECT RATIO VIAS

FIELD

The subject matter herein relates to cleaning high aspect ratio vias during manufacturing.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material relative to the second material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors to achieve high etch selectivity. The high selectivities achieved enable novel process sequences.

Methods are needed to broaden the process sequences which take advantage of the high etch selectivities afforded by these novel remote plasma dry etch processes.

SUMMARY

Reactive-ion etching (RIE) involves the removal of material by ions accelerated in a predetermined direction. A mask is often present to help pattern a substrate. The bombardment The bombardment in combination with oxidation (to remove remaining mask) creates a challenging debris at the bottom of vias formed in the patterned substrate. A method of removing an amorphous silicon/silicon oxide film stack from vias is described. The method may involve a remote plasma including fluorine and a local plasma including fluorine and further formed from a nitrogen-and-hydrogen-containing precursor unexcited in the remote plasma to remove the silicon oxide. The method may then involve a local plasma of inert species to potentially remove any thin carbon layer (leftover from the photoresist) and to treat the amorphous silicon layer in preparation for removal. The method may then involve remote excitation of a hydrogen-containing precursor and removal of the treated amorphous silicon layer with the plasma effluents. The bottom of the vias may then possess exposed single crystal silicon which is conducive to epitaxial single crystal silicon film growth. The methods presented herein may be particularly well suited for 3d NAND (e.g. VNAND) device formation.

Embodiments disclosed herein include methods of etching a patterned substrate. The methods include forming a patterning a photoresist layer on the patterned substrate. The methods further include reactive ion etching a high aspect ratio via into the patterned substrate. Reactive ion etching forms an amorphous silicon layer at the bottom of the high aspect ratio via. The methods further include ashing the photoresist layer from the patterned substrate. Ashing forms a silicon oxide layer over the amorphous silicon layer. The methods further include selectively etching the silicon oxide layer from the bottom of the high aspect ratio via. The methods further include selectively etching the amorphous silicon layer from the bottom of the high aspect ratio via to exposed single crystal silicon.

A thin carbon layer may be formed between the amorphous silicon layer and the silicon oxide layer. The operations of selectively etching the silicon oxide layer and selectively etching the amorphous silicon layer may occur in the same substrate processing region. The thin carbon layer may be removed between selectively etching the silicon oxide layer and selectively etching the amorphous silicon layer. Removing the thin carbon layer may occur in the same substrate processing region as both selectively etching the silicon oxide layer and selectively etching the amorphous silicon layer.

Embodiments disclosed herein include methods of etching a patterned substrate. The methods include placing the patterned substrate in a substrate processing region. The patterned substrate has a high aspect ratio via having a height-to-width aspect ratio greater than 25:1. The methods further include flowing a fluorine-containing precursor into a remote plasma region while forming a remote plasma in the remote plasma region to produce plasma effluents. The methods further include flowing the plasma effluents through a first showerhead and into an intershowerhead region between the first showerhead and a second showerhead. The methods further include combining the plasma effluents with a nitrogen-and-hydrogen-containing precursor in the intershowerhead region. The nitrogen-and-hydrogen-containing precursor has not been passed through any plasma to form a precursor combination. The methods further include flowing the precursor combination through the second showerhead into the substrate processing region. The methods further include forming a local plasma in the substrate processing region. The methods further include removing an exposed portion of silicon oxide from the bottom of the high aspect ratio via.

A width of the high aspect ratio via may be less than 120 nm. The intershowerhead region may be plasma-free during the operation of combining the plasma effluents. An electron temperature within the intershowerhead region may be below 0.5 eV during the operation of combining the plasma effluents. The electron temperature in the remote plasma region and the electron temperature in the substrate processing region may each be above 0.5 eV during the operation of combining the plasma effluents. Removing the exposed portion of silicon oxide may also remove silicon oxide from sidewalls of the high aspect ratio via at an even rate such that a bottom removal rate near a sidewall bottom is within 10% of a top removal rate near a sidewall top. The remote plasma may be capacitively-coupled and the local plasma may be capacitively-coupled. The methods may further include an operation of removing an amorphous silicon portion from the bottom of the high aspect ratio via. The operation of removing the amorphous silicon portion may occur after removing the exposed portion of silicon oxide and the operation of removing the amorphous silicon portion may expose single crystal silicon. The methods may further include an operation of epitaxially growing single crystal silicon on the single crystal silicon. The operation of removing the amorphous silicon portion may further includes flowing a second fluorine-containing precursor into the substrate processing region while forming a fluorine local plasma having a fluorine local plasma power. The operation of removing the amorphous silicon portion includes flowing a hydrogen-containing precursor into the remote plasma region while forming a hydrogen remote plasma having a hydrogen remote plasma power to form hydrogen plasma effluents, wherein the operation of removing the amorphous silicon portion further includes flowing the hydrogen plasma effluents through the first showerhead then into the intershowerhead region, then through the second showerhead and into the substrate processing region and further exciting the hydrogen plasma effluents in the substrate processing region in a hydrogen local plasma having a hydrogen local plasma power. An electron temperature within the intershowerhead region may be below 0.5 eV during the operation of flowing the hydrogen-containing precursor and the electron temperature in the remote plasma region and the electron temperature in the substrate processing region may each be above 0.5 eV during the operation of flowing the hydrogen-containing precursor.

Embodiments disclosed herein include etching a patterned substrate. The methods include placing the patterned substrate in a substrate processing region. The patterned substrate has a high aspect ratio via having a height-to-width aspect ratio greater than 25:1. The methods further include flowing a fluorine-containing precursor into a remote plasma region while forming a remote plasma in the remote plasma region to produce plasma effluents. The methods further include flowing the plasma effluents through a first showerhead and into an intershowerhead region between the first showerhead and a second showerhead. The methods further include combining the plasma effluents with a nitrogen-and-hydrogen-containing precursor which has not been passed through any plasma to form a precursor combination. The methods further include flowing the precursor combination through the second showerhead into the substrate processing region. The methods further include forming a local plasma in the substrate processing region. The methods further include removing an exposed portion of silicon oxide from the bottom of the high aspect ratio via. The methods further include flowing an inert gas into the substrate processing region while forming a sputtering local plasma from the inert gas. The methods further include sputtering the patterned substrate. The methods further include flowing a fluorine-containing precursor into the substrate processing region while forming a fluorine local plasma having a fluorine local plasma power. The methods further include removing amorphous silicon from the bottom of the high aspect ratio via and exposing exposed single crystal silicon.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Reactive-ion etching (RIE) involves the removal of material by ions accelerated in a predetermined direction. A mask is often present to help pattern a substrate. The bombardment The bombardment in combination with oxidation (to remove remaining mask) creates a challenging debris at the bottom of vias formed in the patterned substrate. A method of removing an amorphous silicon/silicon oxide film stack from vias is described. The method may involve a remote plasma comprising fluorine and a local plasma comprising fluorine and further formed from a nitrogen-and-hydrogen-containing precursor unexcited in the remote plasma to remove the silicon oxide. The method may then involve a local plasma of inert species to potentially remove any thin carbon layer (leftover from the photoresist) and to treat the amorphous silicon layer in preparation for removal. The method may then involve remote excitation of a hydrogen-containing precursor and removal of the treated amorphous silicon layer with the plasma effluents. The bottom of the vias may then possess exposed single crystal silicon which is conducive to epitaxial single crystal silicon film growth. The methods presented herein may be particularly well suited for 3d NAND (e.g. VNAND) device formation.

Recently-developed gas-phase remote etch processes have been designed, in part, to remove the need to expose delicate surface patterns to liquid etchants. Liquid etchants are increasingly responsible for collapsing delicate surface patterns as linewidths are reduced. Further improvements in yields, performance and cost reduction are enabled by the methods presented herein. The methods involve performing several operations in the same substrate region of a same substrate processing chamber. The substrate processing region may remain under vacuum during the appropriate operations described herein (e.g. RIE, ashing, and epitaxial growth of silicon may be performed elsewhere). Prior art liquid etch processes are not candidates for the type of integrated process sequences presented herein.

Figure 1A:
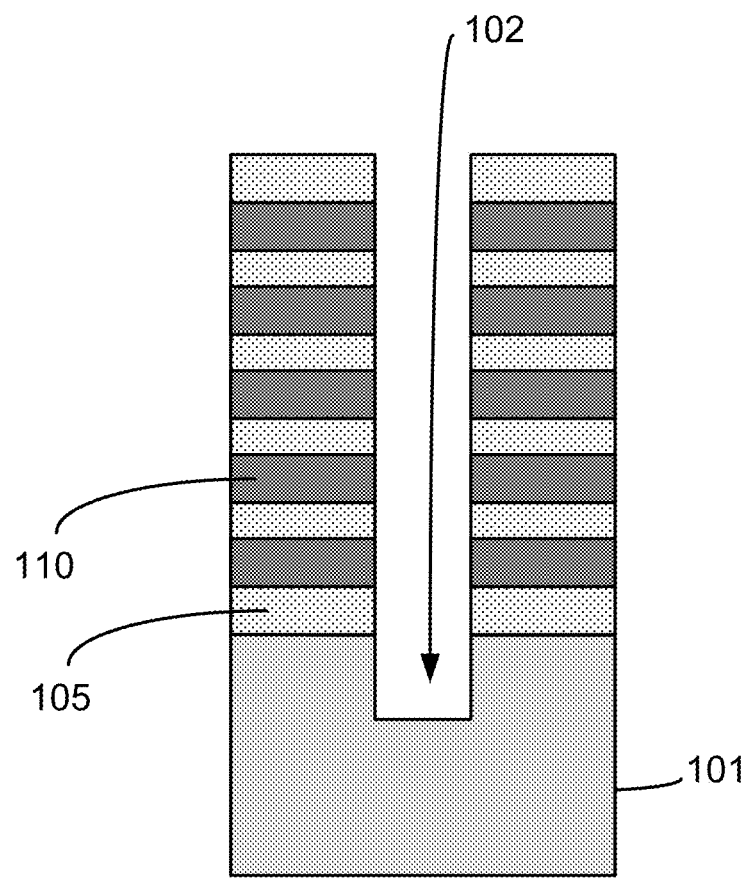
FIG. 1A is a cross-sectional view of a device during an exemplary via cleaning process according to embodiments.
Figure 1B:
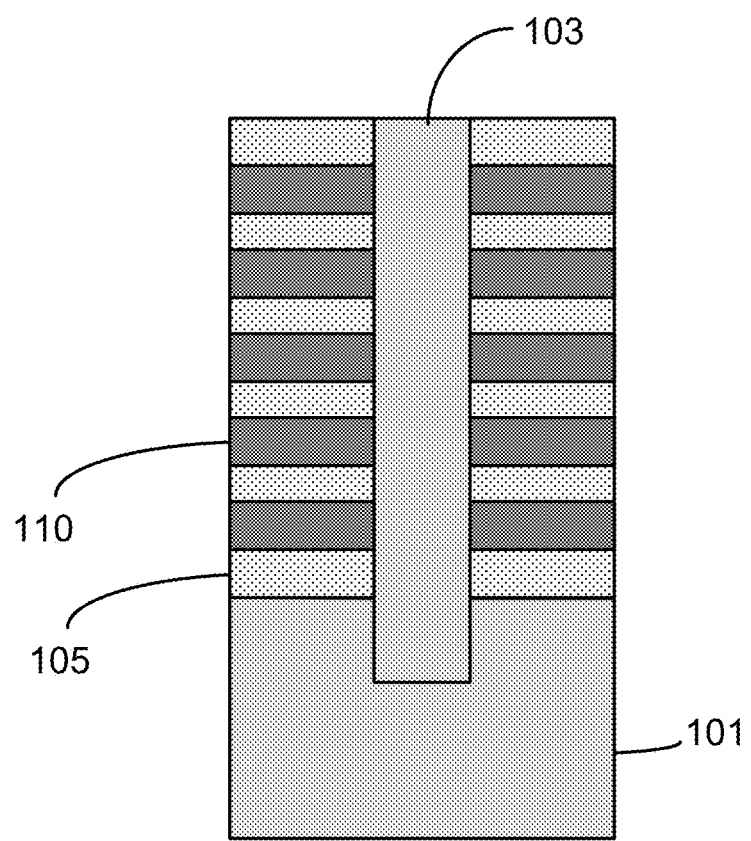
FIG. 1B is a cross-sectional view of a device during an exemplary via cleaning process according to embodiments.
Figure 2:
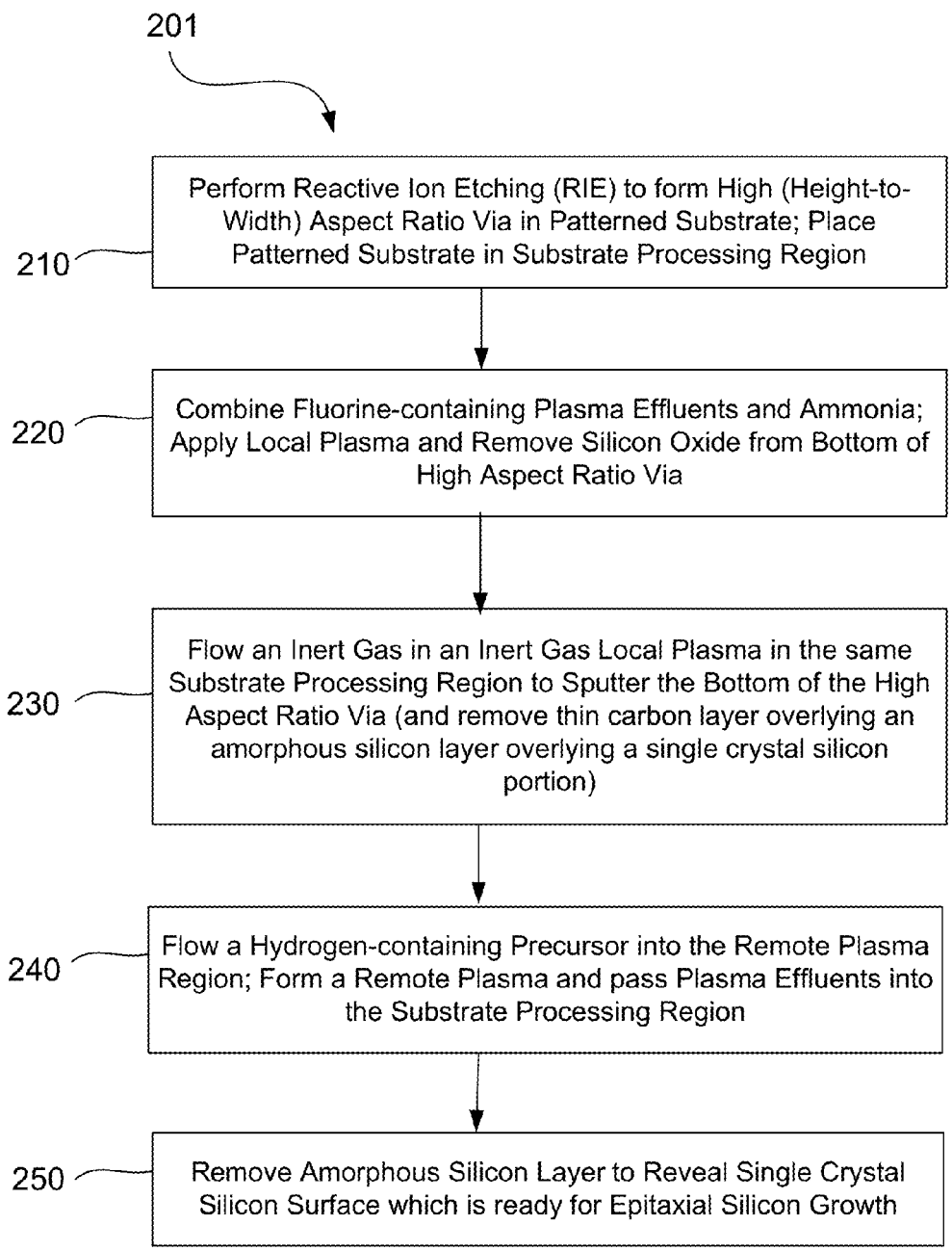
FIG. 2 is a flow chart of a via cleaning process according to embodiments.

To better understand and appreciate the embodiments described herein, reference is now made to FIGS. 1A and 1B which are cross-sectional views of a 3-d flash memory cell during a via cleaning process 201 (see FIG. 2) of forming the 3-d flash memory cells according to embodiments. In one example, a flash memory cell on patterned substrate 101 comprises alternatively stacked silicon oxide 105 and silicon nitride 110. The silicon nitride is sacrificial and is intended for replacement with a conductor before the device is completed. The "Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". Other similar terms may be used whose meanings will now be clear.

A vertical via having high (height-to-width) aspect ratio is formed in operation 210 between two neighboring vertical stacks of silicon oxide 105 and silicon nitride 110 and may be referred to as a high aspect ratio via. Operation 210 may involve reactive ion etching (RIE) the patterned substrate according to embodiments. The high aspect ratio via may be formed into other materials and may be formed in a homogeneous layer of material in embodiments. The high aspect ratio via may be a memory hole as shown in FIGS. 1A-1B and may be used to form 3d NAND which may also be referred to as VNAND (vertical NAND). The high aspect ratio via may be circular as viewed from above. Reactive ion etching may use patterned photoresist to help confine reactive ion etching to etch out the high aspect ratio via in operation 210. The photoresist may then be removed by ashing, for example, by exposing the patterned substrate to ozone which is also considered part of operation 210.

At the conclusion of operation 210, the bottom 102 of the high aspect ratio via may have some debris which needs to be removed to reveal single crystal silicon at the bottom 102 of the high aspect ratio via. The reactive ion etching causes some sputtering of single crystal silicon at the bottom 102 of the high aspect ratio via which transforms a thin layer into amorphous silicon. Ashing the photoresist from patterned substrate 101 may form a thin carbon-containing layer (also referred to as a thin carbon layer) on the amorphous silicon and also may form a thin layer of silicon oxide on the thin carbon layer. The thin silicon oxide layer may be a silicon-rich oxide (SRO) layer. A benefit of the methods presented herein is the exposure of single crystal silicon at the bottom 102 of the high aspect ratio via. The methods enable single crystal silicon to be grown epitaxially which enables the formation of a higher performance VNAND device.

The stack of silicon oxide 105 and silicon nitride 110 may (optionally) be covered with a very thin conformal silicon oxide layer perhaps deposited by atomic layer deposition (ALD). A thin conformal silicon oxide layer is not shown in FIGS. 1A-1B since the layer is optional and very thin if present. The thin conformal silicon oxide layer may have a thickness less than or about 6 nm or less than 5 nm in embodiments. The thin conformal silicon oxide layer may comprise or consist of silicon and oxygen in embodiments. The constrained geometries and thinness of any overlying layers result in damage to devices incorporating the high aspect ratio via when liquid etchants are used, further motivating the gas-phase etching methods presented herein. Liquid etchants cannot be as completely removed and continue to etch. Liquid etchants may ultimately form and/or penetrate through pinholes and damage devices after manufacturing is complete.

Following reactive ion etching and removal of the photoresist, patterned substrate may have a film stack of silicon oxide on a very thin carbon layer on an amorphous silicon layer on single crystal silicon of the substrate. The stack may be present at the bottom 102 of the high aspect ratio via and may be removed by the following operations to expose single crystal silicon in preparation for epitaxial growth of a VNAND active region. Patterned substrate 101 is placed in a substrate processing region of a substrate processing chamber. A flow of nitrogen trifluoride is then introduced into a remote plasma region where the nitrogen trifluoride is excited in a remote plasma struck within the separate plasma region. Plasma effluents are formed in the remote plasma and flowed through a first showerhead. The plasma effluents are combined with ammonia which has not been excited in any plasma and the combination is flowed through a second showerhead and into the substrate processing region in operation 220. A local plasma is struck in the substrate processing region in operation 220 and the silicon oxide at the bottom of the high aspect ratio via is removed. Unused process effluents are then removed from the substrate processing region.

The separate plasma region may be referred to as a remote plasma region herein and may be within a distinct module from the processing chamber or a compartment within the processing chamber separated from the substrate processing region by an aperture or a showerhead. According to embodiments, the plasma effluents may pass through the first showerhead and/or ion suppressor to reduce the electron temperature (to reduce the ion concentration) in the region between the first showerhead and the second showerhead. The region between the first showerhead and the second showerhead may be referred to herein as the intershowerhead region. The intershowerhead region may be plasma-free to increase selectivity and may be referred to as a plasma-free intershowerhead region. The presence of two showerheads may avoid cross-talk between the two separate plasmas which has been found to benefit the etch selectivity as well. Reduced electron temperatures in the intershowerhead region have been found to increase the etch selectivity of the silicon oxide compared to other exposed materials (e.g. polysilicon or silicon) in operation 220. The low electron temperatures which qualify as "plasma-free" are described later in the specification (e.g. <0.5 eV). Meanwhile, the electron temperatures in the remote plasma region and in the substrate processing region may be greater than 0.5 eV during operation 220. Suitably low electron temperatures and methods of achieving these temperatures will be described subsequently.

In general, a fluorine-containing precursor may be flowed into the remote plasma region and the fluorine-containing precursor comprises at least one precursor selected from the group consisting of F, $F_2$, $BrF_3$, $ClF_3$, $NF_3$, HF, fluorinated hydrocarbons, $SF_6$ and $XeF_2$.

Generally speaking, a nitrogen-and-hydrogen-containing precursor may be used in place of the ammonia. The nitrogen-and-hydrogen-containing precursor may consist only of nitrogen and hydrogen, e.g. ammonia ($NH_3$) used in the above example. The nitrogen-and-hydrogen-containing precursor may be hydrazine ($N_2H_4$) in embodiments. The nitrogen-and-hydrogen-containing precursor may be flowed directly into the plasma-free intershowerhead region without first passing the unexcited precursor through any plasma prior to entering the plasma-free intershowerhead region. The nitrogen-and-hydrogen-containing precursor may be referred to as the unexcited precursor since it does not pass through the remote plasma region or any plasma in embodiments. The unexcited precursor may be excited only by the plasma effluents formed in the remote plasma region. The unexcited precursor may be $N_xH_y$ (with x and y each greater than or equal to one). For example, the unexcited precursor may be ammonia in embodiments. The presence of the unexcited precursor just described may increase silicon oxide selectivity for etch operation 220. The plasma effluents may pass through a showerhead and/or ion suppressor to reduce the electron temperature (to reduce the ion concentration) in the plasma-free intershowerhead region prior to combination with unexcited NxHy precursor.

An inert gas, e.g. Ar, may then be flowed into the substrate processing region in operation 230. The inert gas may be flowed into the remote plasma region or directly into the substrate processing region during operation 230. Generally speaking, the inert gas may comprise or consist of only gases which do not form covalent bonds within the patterned substrate in embodiments. The inert gas may comprise or consist of one or more of Ne, Ar or He according to embodiments. Operation 230 may remove the carbon layer from the bottom 102 of the high aspect ratio via in embodiments. Operation 230 may also prepare the amorphous silicon at the bottom 102 for removal during the next operation. Operation 250 (to be described) may not successfully remove the amorphous silicon from the bottom 102 if operation 230 is omitted according to embodiments.

A hydrogen-containing precursor, e.g. $H_2$, may then be flowed into the substrate processing region in operation 240-1. The hydrogen-containing precursor may be flowed into the remote plasma region during operation 240-1. Generally speaking, the hydrogen-containing precursor may include one or more of atomic hydrogen, molecular hydrogen, ammonia, a hydrocarbon and an incompletely halogen-substituted hydrocarbon according to embodiments. The hydrogen-containing precursor may comprise or consist only of hydrogen in embodiments. A hydrogen remote plasma is struck in the remote plasma region to excite the hydrogen-containing precursor and form plasma effluents. Plasma effluents formed from the hydrogen-containing precursor may pass through the first showerhead and into the intershowerhead region and then into the substrate processing region. In the substrate processing region, the plasma effluents may be further excited in a hydrogen local plasma to direct excited species down to the bottom of the high aspect ratio via in patterned substrate 101. In this way, the excited species remove the amorphous silicon and expose single crystal silicon in operation 250. Unused process effluents are removed from the substrate processing region. Reduced electron temperatures in the intershowerhead region have been found to increase the etch selectivity of the amorphous silicon compared to other exposed materials (e.g. polysilicon or silicon) in operation 240-1. The low electron temperatures which qualify as "plasma-free" are described later in the specification (e.g. <0.5 eV). Meanwhile, the electron temperatures in the remote plasma region and in the substrate processing region may be greater than 0.5 eV during operation 240-1.

Epitaxial silicon 103 may then be grown using the exposed portion of single crystal silicon on patterned substrate 101 to form material for a high mobility channel as shown in FIG. 1B. Epitaxial silicon 103 may be grown by exposing patterned substrate 101 to silane, disilane, dichlorosilane or another silicon-containing precursor at relatively high substrate temperature. The temperature of patterned substrate 101 may be greater than 650° C., greater than 700° C. or greater than 800° C. according to embodiments. Epitaxial growth of epitaxial silicon 103 may be performed in another substrate processing chamber so patterned substrate 101 may be removed from the substrate processing region prior to performing epitaxy according to embodiments.

The high aspect ratio via has a high height-to-width aspect ratio as viewed in FIGS. 1A-1B. As viewed from above, the high aspect ratio via may have a low aspect ratio which makes removal of the debris from the bottom 102 of the high aspect ratio via difficult and creates the benefit of the methods presented herein. A via may appear, e.g., circular as viewed from above the patterned substrate lying flat. Vias may or may not be filled with epitaxially grown silicon in embodiments. A width of the high aspect ratio via may be less than 120 nm, less than 100 nm, less than 80 nm or less than 60 nm according to embodiments. An aspect ratio of the high aspect ratio via may be about 1:1, as viewed from above. A height-to-width aspect ratio of the high aspect ratio via may be greater than 35:1, greater than 40:1 or greater than 50:1 in embodiments.

Precursors may be flowed into the appropriate regions of the substrate processing chamber during the operations of via cleaning process 201. The fluorine-containing precursor may be flowed into the remote plasma region at a flow rate of between 25 sccm (standard cubic centimeters per minute) and 500 sccm during operation 220. The nitrogen-and-hydrogen-containing precursor (e.g. $NH_3$) is supplied to the intershowerhead region at a flow rate of between 25 sccm and 2,000 sccm during operation 220. The inert gas (e.g. Ar) is supplied at a flow rate of between 50 sccm and 3,000 sccm during operation 230. The hydrogen-containing precursor may be flowed into the remote plasma region at a flow rate of between 25 sccm and 3,000 slm. One of ordinary skill in the art would recognize that other gases and/or flows may be used depending on a number of factors including processing chamber configuration, substrate size, geometry and layout of features being etched.

The flows of the fluorine-containing precursor, the nitrogen-and-hydrogen-containing precursor and the hydrogen-containing precursor may further include one or more relatively inert gases such as He, $N_2$, Ar. The inert gas can be used to improve plasma stability or process uniformity. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

The number and size of openings in the first showerhead and the second showerhead may be such that the pressure in the remote plasma region, the intershowerhead region and the substrate processing region are essentially the same in embodiments. During operation 220, the pressure in the remote plasma region, intershowerhead region and substrate processing region may be between 0.01 Torr and 50 Torr, between 0.1 Torr and 15 Torr or between 0.5 Torr and 5 Torr according to embodiments. During operation 230, the pressure in the remote plasma region, intershowerhead region and substrate processing region may be between 0.001 Torr and 5 Torr, between 0.01 Torr and 1 Torr or between 0.03 Torr and 0.3 Torr in embodiments. During operation 240-1, the pressure in the remote plasma region, intershowerhead region and substrate processing region may be between 0.01 Torr and 50 Torr, between 0.05 Torr and 10 Torr or between 0.3 Torr and 3 Torr according to embodiments. During operations 220, 230 and/or 240-1, the temperature of the patterned substrate may be between 0° C. and 300° C., between 10° C. and 250° C., or between 50° C. and 200° C. in embodiments.

Via cleaning method 201 also includes applying energy to precursors in the remote plasma region and/or the substrate processing region in operations 220, 230 and 240-1. In an embodiment, the energy is applied using radio frequency (RF) power and capacitively-coupled plasma plates to form a capacitively-coupled plasma in the remote plasma region and the substrate processing region as appropriate. The remote plasma power and the local plasma power may be applied using a capacitively-coupled plasma unit by applying plasma power between plates above and below the appropriate region.

In operation 220, the remote plasma power applied to the remote plasma region may be between 20 watts and 1,000 watts, between 40 watts and 800 watts, between about 60 watts and about 600 watts, or between about 80 watts and about 400 watts in embodiments. The capacitively-coupled plasma unit may be disposed remote from the substrate processing region but still within the substrate processing chamber. For example, the capacitively-coupled plasma unit and the plasma generation region may be separated from the gas reaction region by a pair of showerheads. Plasma power is simultaneously applied to the substrate processing region during operation 220. The plasma in the substrate processing region may increase the homogeneity of silicon oxide etch rate on the walls of the high aspect ratio via. Uniformly widening the via in addition to cleaning the bottom may be desirable in embodiments. The etch rate near the bottom of the high aspect ratio via may be 40% less than the etch rate near the opening if the local plasma is omitted. The etch rate near the bottom may be within 10%, 8%, 5% or even within 3% of the etch rate near the top by applying local plasma power in combination with the remote plasma power according to embodiments. The local plasma power may be between 5 watts and 800 watts, between 10 watts and 700 watts, between 25 watts and 500 watts, or between 50 watts and 200 watts in embodiments. The local plasma power may increase the relative concentration of reactive species at the bottom of the high aspect ratio via without significantly compromising the high selectivity afforded by the remote plasma power in combination with the showerhead and optional ion suppressors described herein.

In operation 230, remote plasma power is not applied to the remote plasma region in embodiments. Plasma power is applied to the substrate processing region during operation 230 according to embodiments. The plasma in the substrate processing region may accelerate the inert gas towards the substrate and remove the carbon layer from the bottom of the high aspect ratio via. The process may be referred to as sputtering and sputtering modifies the amorphous silicon portion underneath the carbon layer such that operation 240 may remove the modified amorphous silicon portion. The local plasma power may be between 5 watts and 800 watts, between 10 watts and 700 watts, between 25 watts and 500 watts, or between 50 watts and 200 watts in embodiments.

In operation 240-1, the remote plasma power applied to the remote plasma region may be between 20 watts and 1,000 watts, between 40 watts and 800 watts, between about 60 watts and about 600 watts, or between about 80 watts and about 400 watts in embodiments. Plasma power is simultaneously applied to the substrate processing region during operation 240-1. The local plasma power may be between 5 watts and 800 watts, between 10 watts and 700 watts, between 25 watts and 500 watts, or between 50 watts and 200 watts in embodiments. The local plasma power may increase the relative concentration of reactive species at the bottom of the high aspect ratio via without significantly compromising the high selectivity afforded by the remote plasma power in combination with the showerhead and optional ion suppressors described herein.

An alternative solution has also been developed to remove amorphous silicon thereby replacing operation 240-1 and accomplishing operation 250 in another manner according to embodiments. A fluorine-containing precursor may be flowed into the substrate processing region in alternative operation 240-2. The fluorine-containing precursor may include at least one precursor selected from the group consisting of F, $F_2$, $BrF_3$, $ClF_3$, $NF_3$, HF, fluorinated hydrocarbons, $SF_6$ and $XeF_2$ in embodiments. A fluorine local plasma is struck in the substrate processing region to excite the fluorine-containing precursor. The fluorine-containing precursor may or may not be flowed through the remote plasma region and the showerheads since no remote excitation is really necessary. The fluorine local plasma may direct excited species down to the bottom of the high aspect ratio via in patterned substrate 101. In this way, the excited species preferentially remove the amorphous silicon and expose single crystal silicon in operation 250. Unused process effluents are removed from the substrate processing region. The electron temperatures in the substrate processing region may be greater than 0.5 eV during alternative operation 240-2. During operation 240-2, the pressure in the substrate processing region may be between 0.001 Torr and 5 Torr, between 0.01 Torr and 1 Torr or between 0.03 Torr and 0.3 Torr according to embodiments. Alternative operation 240-2 includes applying energy to precursors in the substrate processing region. The local plasma power may be between 5 watts and 800 watts, between 10 watts and 700 watts, between 25 watts and 500 watts, or between 50 watts and 350 watts in embodiments. The fluorine-containing precursor may be flowed into the substrate processing region at a flow rate of between 0.2 sccm and 100 sccm, between 1 sccm and 20 sccm, or between 2 sccm and 15 sccm during operation 240-2 in embodiments. Helium may also be supplied into the substrate processing region during operation 240-2 and may be provided at a flow rate of between 100 sccm and 500 sccm.

Despite the optional use of local plasma excitation in the multiple remote plasma operations described herein, an ion suppressor (which may be the showerhead) may be used to provide radical and/or neutral species entering the intershowerhead region between the first showerhead and the second showerhead. The ion suppressor may also be referred to as an ion suppression element. In embodiments, for example, the ion suppressor is used to filter etching plasma effluents en route from the remote plasma region to the intershowerhead region. The ion suppressor may be used to provide a reactive gas having a higher concentration of radicals than ions. Plasma effluents pass through the ion suppressor disposed between the remote plasma region and the intershowerhead region. The ion suppressor functions to dramatically reduce or substantially eliminate ionic species traveling from the plasma generation region to the second showerhead.

The electron temperature may be measured using a Langmuir probe in the intershowerhead region during excitation of a plasma in the remote plasma. The electron temperature may be less than 0.5 eV, less than 0.45 eV, less than 0.4 eV, or less than 0.35 eV. These extremely low values for the electron temperature are enabled by the presence of the showerhead and/or the ion suppressor. Uncharged neutral and radical species may pass through the openings in the ion suppressor and into the intershowerhead region.

The intershowerhead region may be described herein as "plasma-free" during the etch operations described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region may encroach to some small degree upon the intershowerhead region through the apertures in the showerhead. Furthermore, a low intensity plasma may be created in the intershowerhead region without eliminating desirable features of the etch processes described herein. All causes for a plasma having much lower intensity ion density than the chamber plasma region during the creation of the excited plasma effluents do not deviate from the scope of "plasma-free" as used herein. In embodiments, the substrate processing region or the remote plasma region may also be plasma-free depending on the operation.

Figure 3A:
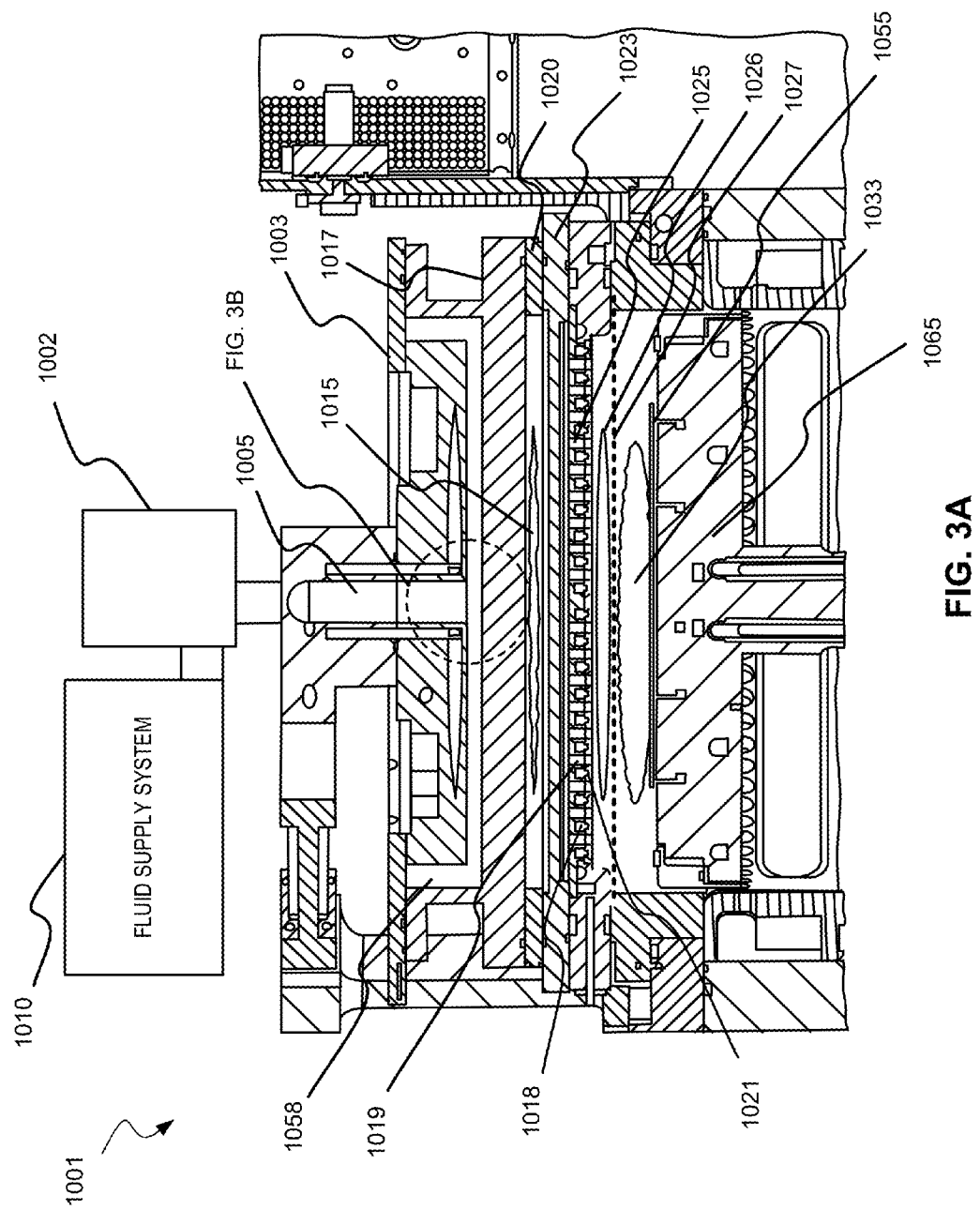
FIG. 3A shows a schematic cross-sectional view of a substrate processing chamber according to embodiments.

FIG. 3A shows a cross-sectional view of an exemplary substrate processing chamber 1001 with a partitioned plasma generation region within the processing chamber. During film etching, a process gas may be flowed into chamber plasma region 1015 through a gas inlet assembly 1005. A remote plasma system (RPS) 1002 may optionally be included in the system, and may process a first gas which then travels through gas inlet assembly 1005. The process gas may be excited within RPS 1002 prior to entering chamber plasma region 1015. Accordingly, the appropriate precursor(s) (e.g. the fluorine-containing precursor or the hydrogen-containing precursor) as discussed above may pass through RPS 1002 or bypass the RPS unit in embodiments.

A cooling plate 1003, faceplate 1017, ion suppressor 1023, first showerhead 1025, second showerhead 1027 and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −20° C. to 200° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The faceplate 1017, or a conductive top portion of the chamber, and first showerhead 1025 are shown with an insulating ring 1020 located between the features, which allows an AC potential to be applied to the faceplate 1017 relative to first showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in chamber plasma region 1015.

The plurality of holes in ion suppressor 1023 may be configured to control the passage of the activated gas, i.e., the ionic, radical, and/or neutral species, through ion suppressor 1023. For example, the aspect ratio of the holes, or the hole diameter to length, and/or the geometry of the holes may be controlled so that the flow of ionically-charged species in the activated gas passing through ion suppressor 1023 is reduced. The holes in ion suppressor 1023 may include a tapered portion that faces chamber plasma region 1015, and a cylindrical portion that faces first showerhead 1025. The cylindrical portion may be shaped and dimensioned to control the flow of ionic species passing to first showerhead 1025. An adjustable electrical bias may also be applied to ion suppressor 1023 as an additional means to control the flow of ionic species through ion suppressor 1023. Ion suppressor 1023 may equivalently be referred to as ion suppression element 1023. Ion suppression element 1023 may function to reduce or eliminate the amount of ionically charged species traveling from the plasma generation region to intershowerhead region 1026. Uncharged neutral and radical species may still pass through the openings in the ion suppressor.

Plasma power can be of a variety of frequencies or a combination of multiple frequencies. In the exemplary processing system the plasma may be provided by plasma power delivered to faceplate 1017 relative to ion suppressor 1023 and/or first showerhead 1025. The plasma power may be between about 10 watts and about 5000 watts in embodiments. The RF frequency applied in the exemplary processing system may be low RF frequencies less than about 200 kHz, high RF frequencies between about 10 MHz and about 15 MHz, or microwave frequencies greater than or about 1 GHz in embodiments. The plasma power may be capacitively-coupled (CCP) into the remote plasma region. A similar CCP with similar operating parameters may be used to form the local plasma in substrate processing region 1033.

Excited species derived from the process gas in chamber plasma region 1015 may travel through apertures in the ion suppressor 1023, and/or first showerhead 1025 and react with an additional precursor flowing directly into intershowerhead region 1026. The additional precursor may not be excited in any plasma prior to entering intershowerhead region 1026. The additional precursor may enter intershowerhead region 1026 from a separate portion of first showerhead 1025. Alternatively, if all precursor species are being excited in chamber plasma region 1015, no additional precursors may be flowed through the separate portion of first showerhead 1025. Little or no plasma may be present in intershowerhead region 1026 during the remote plasma etch processes described herein in embodiments. Excited derivatives of the precursors may combine in intershowerhead region 1026. The combination of precursors and/or plasma effluents may then be flowed into substrate processing region 1033 through second showerhead 1027 to react with the substrate to etch structures or remove species from the substrate. Second showerhead 1027 may have smaller through holes than first showerhead 1025. A local plasma may be formed in substrate processing region 1033 concurrently with the remote plasma in the chamber plasma region 1015. Alternatively, the substrate processing region 1033 may be plasma-free in embodiments.

Figure 3B:
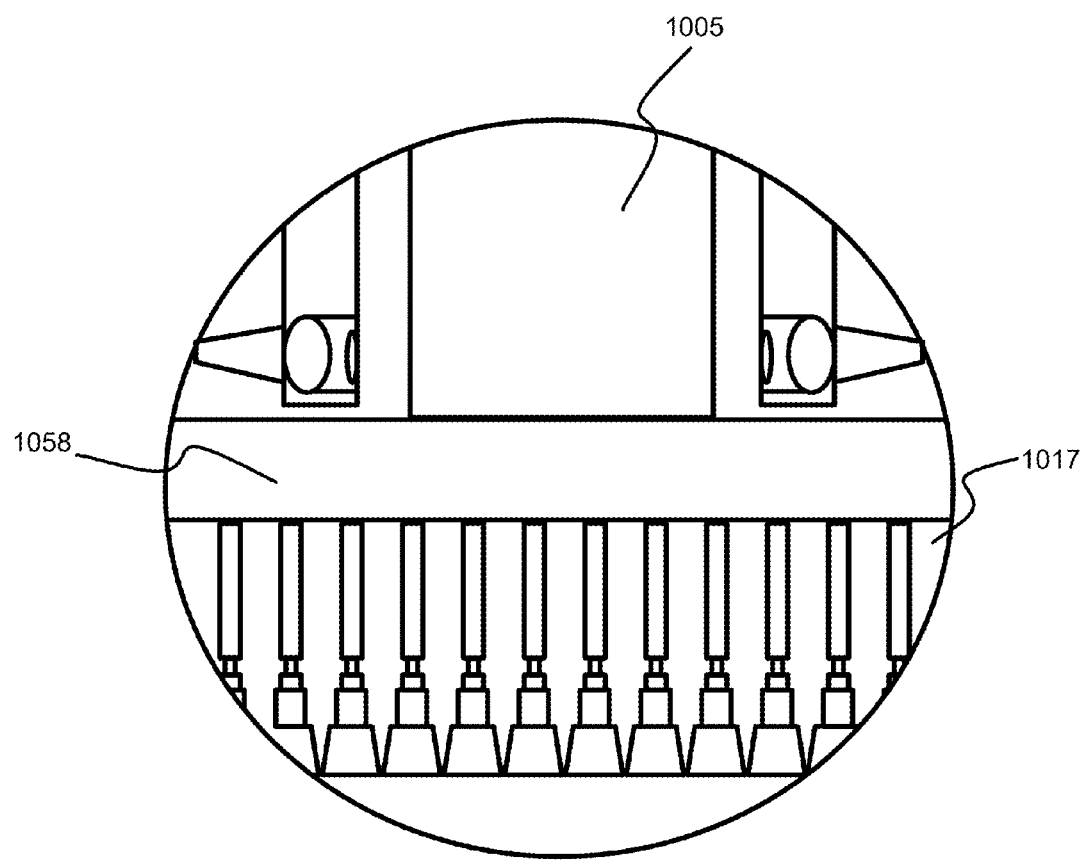
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as first showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of substrate processing region 1033 to provide limited interaction with chamber components and each other prior to being delivered into substrate processing region 1033.

First showerhead 1025 may be configured to define a volume 1018 which opens only to substrate processing region 1033 and not directly into chamber plasma region 1015. First showerhead 1025 may be configured to provide first fluid channels 1019 all the way through first showerhead 1025, and second fluid channels 1021 from volumes 1018 into substrate processing region 1033. The formed channels may be configured to provide fluid access from the volume 1018 by way of second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead described.

In the embodiment shown, first showerhead 1025 may distribute by way of first fluid channels 1019 process gases which contain plasma effluents upon excitation by a plasma in chamber plasma region 1015. In embodiments, the process gas introduced into RPS 1002 and/or chamber plasma region 1015 may contain fluorine or a hydrogen-containing precursor such as $H_2$. The process gas may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

Figure 3C:
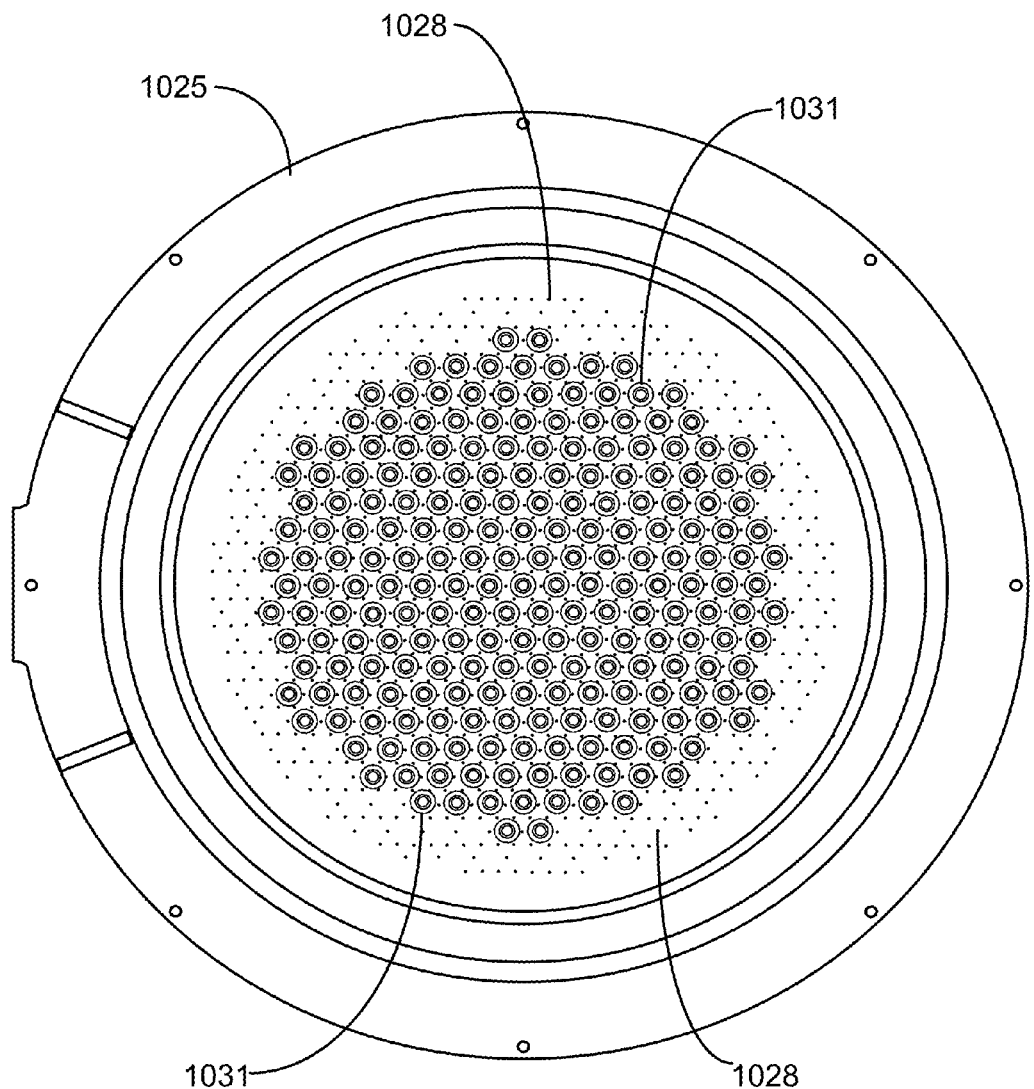
FIG. 3C shows a bottom view of a showerhead according to embodiments.

FIG. 3C is a bottom view of first showerhead 1025 for use with a processing chamber in embodiments. First showerhead 1025 corresponds with the showerhead shown in FIG. 3A. Through-holes 1031, which show a view of first fluid channels 1019, may have a plurality of shapes and configurations to control and modify the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Figure 4:
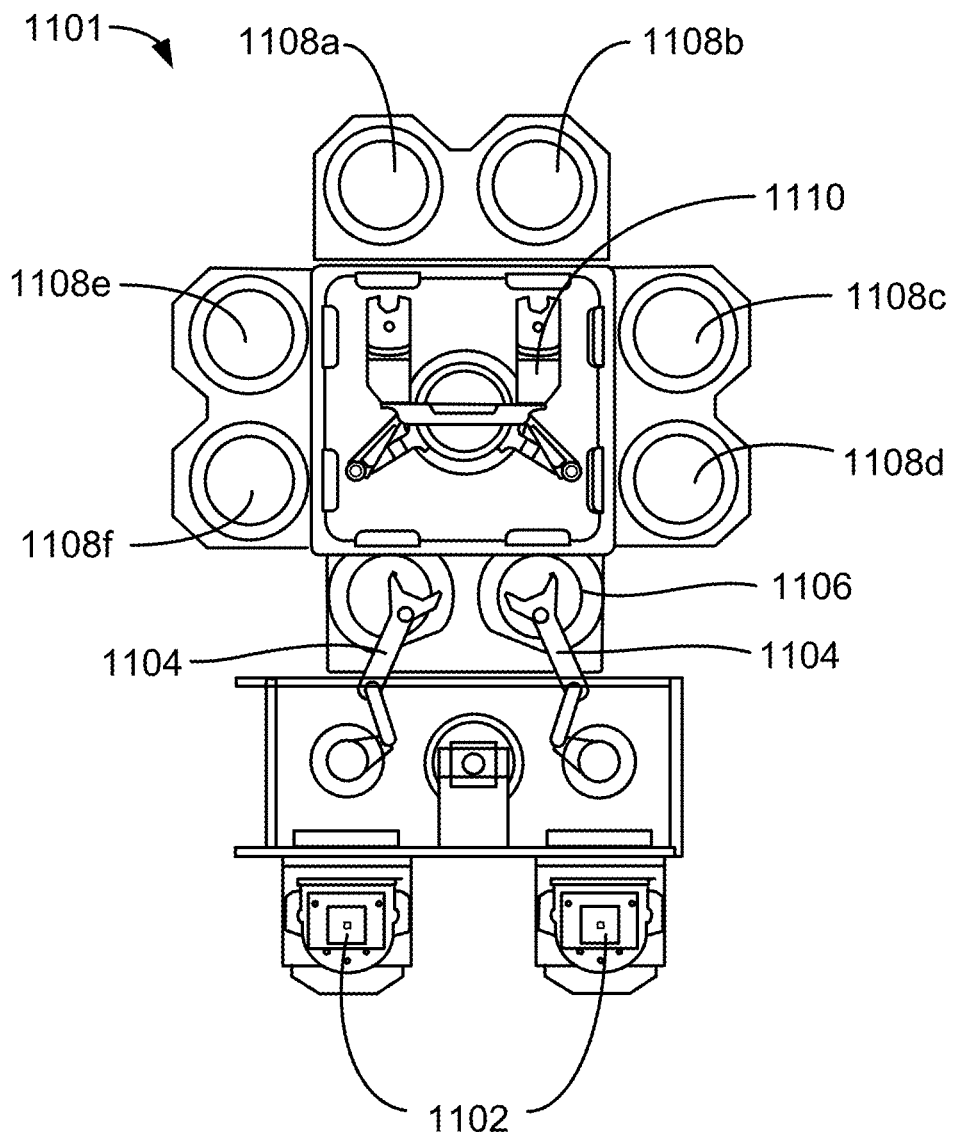
FIG. 4 shows a top view of an exemplary substrate processing system according to embodiments.

Embodiments of the dry etch systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

First showerhead 1025 may be referred to as a dual-channel showerhead as a result of the two distinct pathways into the substrate processing region. The fluorine-containing precursor or the hydrogen-containing precursor may be flowed through the through-holes in the dual-zone showerhead and auxiliary precursors may pass through separate zones in the dual-zone showerhead. The separate zones may open into the substrate processing region but not into the remote plasma region as described above.

Combined flow rates of precursors and plasma effluents into the substrate processing region may account for 0.05% to about 20% by volume of the overall gas mixture; the remainder being carrier gases. The fluorine-containing precursor or the hydrogen-containing precursor flowed into the remote plasma region but the plasma effluents has the same volumetric flow ratio, in embodiments. In the case of the fluorine-containing precursor, a purge or carrier gas may be first initiated into the remote plasma region before those of the fluorine-containing gas and the hydrogen-containing precursor to stabilize the pressure within the remote plasma region.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon oxide" of the patterned substrate is predominantly $SiO_2$ but may include concentrations of other elemental constituents such as, e.g., nitrogen, hydrogen and carbon. In some embodiments, silicon oxide portions etched using the methods disclosed herein consist essentially of silicon and oxygen. Exposed "silicon nitride" of the patterned substrate is predominantly $Si_3N_4$ but may include concentrations of other elemental constituents such as, e.g., oxygen, hydrogen and carbon. In some embodiments, silicon nitride portions described herein consist essentially of silicon and nitrogen. Exposed "silicon" of the patterned substrate is predominantly Si but may include concentrations of other elemental constituents such as, e.g., nitrogen, oxygen, hydrogen and carbon. In some embodiments, silicon portions described herein consist essentially of silicon.

A gap is an etched geometry having either any horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. A "via" is a short gap with horizontal aspect ratio, as viewed from above, near unity. A via may appear circular, slightly oval, polygonal or slightly rectangular. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances. Similarly, a conformal layer refers to a layer having generally uniform thickness. A conformal layer may have an outer surface in the same shape as the inner surface, i.e., the outer surface and the inner surface are generally parallel. A person having ordinary skill in the art will recognize that the two surfaces likely cannot be 100% parallel and thus the term "generally" allows for acceptable tolerances.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine precursors" describe radical precursors which contain fluorine but may contain other elemental constituents. "Radical-hydrogen precursors" describe radical precursors which contain carbon and hydrogen but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a patterned substrate, the method comprising:
   placing the patterned substrate in a substrate processing region, wherein the patterned substrate has a high aspect ratio via having a height-to-width aspect ratio greater than 25:1;
   flowing a fluorine-containing precursor into a remote plasma region while forming a remote plasma in the remote plasma region to produce plasma effluents;
   flowing the plasma effluents through a first showerhead and into an intershowerhead region between the first showerhead and a second showerhead;
   combining the plasma effluents with a nitrogen-and-hydrogen-containing precursor in the intershowerhead region, wherein the nitrogen-and-hydrogen-containing precursor has not been passed through any plasma to form a precursor combination;
   flowing the precursor combination through the second showerhead into the substrate processing region;
   forming a local plasma in the substrate processing region; and
   removing an exposed portion of silicon oxide from the bottom of the high aspect ratio via.

2. The method of claim 1 wherein a width of the high aspect ratio via is less than 120 nm.

3. The method of claim 1 wherein the intershowerhead region is plasma-free during the operation of combining the plasma effluents.

4. The method of claim 1 wherein an electron temperature within the intershowerhead region is below 0.5 eV during the operation of combining the plasma effluents and the electron temperature in the remote plasma region and the electron temperature in the substrate processing region are each above 0.5 eV during the operation of combining the plasma effluents.

5. The method of claim 1 wherein removing the exposed portion of silicon oxide also removes silicon oxide from sidewalls of the high aspect ratio via at an even rate such that a bottom removal rate near a sidewall bottom is within 10% of a top removal rate near a sidewall top.

6. The method of claim 1 wherein the remote plasma is capacitively-coupled and the local plasma is capacitively-coupled.

7. The method of claim 1 further comprising an operation of removing an amorphous silicon portion from the bottom of the high aspect ratio via; wherein the operation of removing the amorphous silicon portion occurs after removing the exposed portion of silicon oxide and the operation of removing the amorphous silicon portion exposes single crystal silicon.

8. The method of claim 7 further comprising an operation of epitaxially growing single crystal silicon on the single crystal silicon.

9. The method of claim 7 wherein the operation of removing the amorphous silicon portion further comprises flowing a second fluorine-containing precursor into the substrate processing region while forming a fluorine local plasma having a fluorine local plasma power.

10. The method of claim 7 wherein the operation of removing the amorphous silicon portion comprises flowing a hydrogen-containing precursor into the remote plasma region while forming a hydrogen remote plasma having a hydrogen remote plasma power to form hydrogen plasma effluents, wherein the operation of removing the amorphous silicon portion further comprises flowing the hydrogen plasma effluents through the first showerhead then into the intershowerhead region, then through the second showerhead and into the substrate processing region and further exciting the hydrogen plasma effluents in the substrate processing region in a hydrogen local plasma having a hydrogen local plasma power.

11. The method of claim 10 wherein an electron temperature within the intershowerhead region is below 0.5 eV during the operation of flowing the hydrogen containing precursor and the electron temperature in the remote plasma region and the electron temperature in the substrate processing region are each above 0.5 eV during the operation of flowing the hydrogen-containing precursor.

12. A method of etching a patterned substrate, the method comprising:

placing the patterned substrate in a substrate processing region, wherein the patterned substrate has a high aspect ratio via having a height-to-width aspect ratio greater than 25:1;
flowing a fluorine-containing precursor into a remote plasma region while forming a remote plasma in the remote plasma region to produce plasma effluents;
flowing the plasma effluents through a first showerhead and into an intershowerhead region between the first showerhead and a second showerhead;
combining the plasma effluents with a nitrogen-and-hydrogen-containing precursor which has not been passed through any plasma to form a precursor combination;
flowing the precursor combination through the second showerhead into the substrate processing region;
forming a local plasma in the substrate processing region;
removing an exposed portion of silicon oxide from the bottom of the high aspect ratio via;
flowing an inert gas into the substrate processing region while forming a sputtering local plasma from the inert gas;
sputtering the patterned substrate;
flowing a fluorine-containing precursor into the substrate processing region while forming a fluorine local plasma having a fluorine local plasma power; and
removing amorphous silicon from the bottom of the high aspect ratio via and exposing exposed single crystal silicon.

\* \* \* \* \*